(12) United States Patent
Brown

(10) Patent No.: US 7,737,507 B2
(45) Date of Patent: Jun. 15, 2010

(54) INSULATED GATE FIELD EFFECT TRANSISTORS

(75) Inventor: Adam R. Brown, Bramhall (GB)

(73) Assignee: NXP B.V., Eindhoven (NL)

( * ) Notice: Subject to any disclaimer, the term of this patent is extended or adjusted under 35 U.S.C. 154(b) by 561 days.

(21) Appl. No.: 11/658,223

(22) PCT Filed: Jul. 18, 2005

(86) PCT No.: PCT/IB2005/052388

§ 371 (c)(1),
(2), (4) Date: Jan. 22, 2007

(87) PCT Pub. No.: WO2006/011110

PCT Pub. Date: Feb. 2, 2006

(65) Prior Publication Data

US 2008/0315278 A1 Dec. 25, 2008

(30) Foreign Application Priority Data

Jul. 20, 2004 (GB) .................................. 0416175.8

(51) Int. Cl.
*H01L 27/088* (2006.01)

(52) U.S. Cl. ................ 257/391; 257/314; 257/376; 257/392; 257/487; 257/E29.263

(58) Field of Classification Search ................ 257/314, 257/376, 391, 392, 487, E29.263
See application file for complete search history.

(56) References Cited

U.S. PATENT DOCUMENTS

| 6,198,128 | B1 * | 3/2001 | Asakura et al. | 257/337 |
| 6,603,157 | B2 * | 8/2003 | Dupuy et al. | 257/202 |
| 2001/0040480 | A1 * | 11/2001 | Lee | 327/538 |
| 2002/0177279 | A1 * | 11/2002 | Adkisson et al. | 438/289 |

FOREIGN PATENT DOCUMENTS

| DE | 102 46 960 | 4/2004 |
| EP | 0 561 267 | 9/1993 |

* cited by examiner

*Primary Examiner*—Tan N Tran

(57) ABSTRACT

The invention relates to FETs with stripe cells (6). Some of the cells have alternating low and high threshold regions (10, 8) along their length. In a linear operations regime, the low threshold regions conduct preferentially and increase the current density, thereby reducing the risk of thermal runaway. By distributing the low threshold regions (10) along the length of the cells (6), the risk of current crowding is reduced.

7 Claims, 2 Drawing Sheets

INSULATED GATE FIELD EFFECT TRANSISTORS

Figure 1:
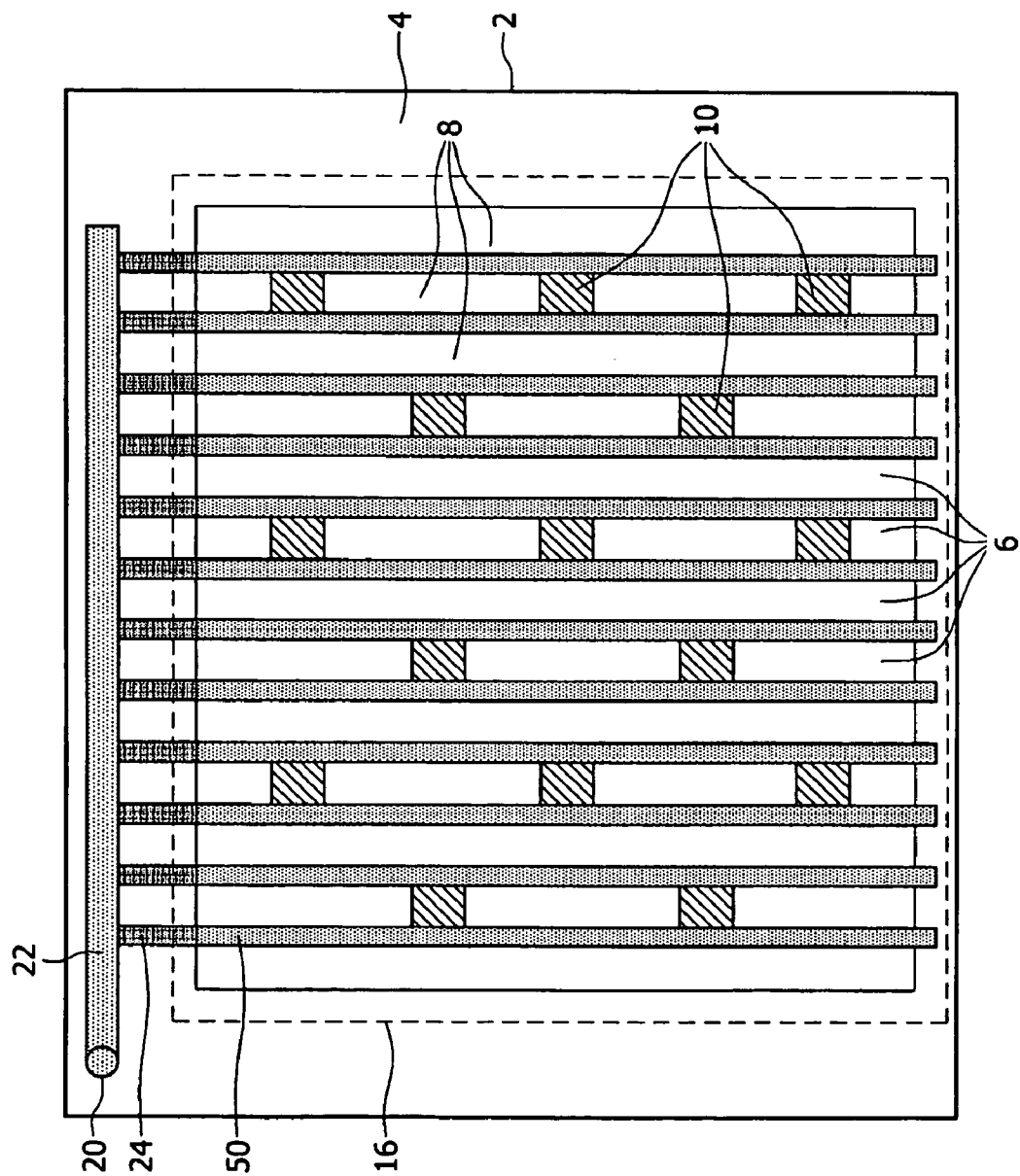

The invention relates to insulated gate field effect transistors and methods of using them.

Power metal oxide semiconductor field effect transistors (MOSFETs) are generally used as switches in which they are either fully on or fully off. However, MOSFETs can also be used in a linear region of operation to self-protect the MOSFET from over-voltage spikes by turning on and absorbing power as part of a linear region of operation, typically using a dynamic current circuit, or to limit the current for a short period of time long enough for a decision to be made to switch the current to a safe state.

Other circuits also require operation in the linear mode. For example, many simple motors are controlled in this way, such as fan motors.

A problem occurs when modern power MOSFETs, especially trench MOSFETs and vertical double diffused MOSFETS (VDMOS), are operated in the linear regime. Modern devices typically have small cell pitches (<10 µm) and these devices are susceptible to thermal runaway.

The reason for the thermal runaway in small devices is the existence of a critical current density $J_c$ above which the current density decreases with increasing temperature but below which the current density increases with increasing temperature. If a FET is operated below the critical current density $J_c$ a small increase in temperature increases current density, which causes an increase in temperature, causing still higher current density, i.e. thermal runaway.

The value of the critical current density $J_c$ is determined by two competing effects. Firstly, as temperature increases the resistance of the channel increases. This decreases current density with increasing temperature. Secondly, as temperature increases, the threshold voltage of the MOSFET decreases. This change in threshold voltage does not matter when the MOSFET is switched hard on. However, in the linear regime, the decreased threshold voltage changes the effective gate voltage thereby increasing current density with increasing temperature. As the gain increases, the second effect becomes relatively more important. Modern MOSFETs have high values of gate width per unit area and are operated at currents such that the second effect is dominant, i.e. the MOSFETs are operated below $J_c$.

This means that modern power MOSFETs are susceptible to thermal runaway which can in turn lead to device failure.

As will be appreciated by the skilled person the problem is not limited to devices using oxide on silicon, but can occur in any power FET.

There is accordingly a need for a design of FET in which this problem is alleviated.

U.S. Pat. No. 6,503,786 describes an approach using devices with asymmetric channels with different threshold voltages. The content is very similar to that of related U.S. Pat. No. 6,664,594.

Another document, US2003/0230766, relates to a different problem, namely reducing parasitic capacitance. It describes a FET with a number of cells, the threshold voltage being different in some of the cells to others of the cells.

According to the invention there is provided an insulated gate field effect transistor according to claim 1.

By dividing at least some of the cells into a plurality of regions with varying threshold voltage, when the transistor is just turned on conduction will occur preferentially in regions of low threshold voltage. The current density in these regions will accordingly be higher, either above the critical current density $J_c$ or less far below it, reducing the risk of thermal runaway.

The field effect transistor according to the invention represents a different solution to that of asymmetric cells taught by U.S. Pat. No. 6,503,786. Moreover, the solution according to the invention has advantages.

By arranging for the cells to be stripes, and to have the varying threshold voltage regions distributed along at least some of the stripes, a problem with such increased current density can be mitigated. In U.S. Pat. No. 6,503,786 there are continuous areas taking current and there is accordingly the risk of current crowding in these areas.

By ensuring that the lower threshold regions are distributed along the same stripes as the higher threshold regions large areas of high current are avoided thus reducing the risk of current crowding.

Moreover, the invention allows the percentage of low threshold voltage region to be easily selected whilst still ensuring that the low threshold regions are distributed over the substrate. In contrast, U.S. Pat. No. 6,503,786 only suggests varying the active area of asymmetry in voltage threshold which may lead to current crowding or uneven temperature effects in the areas of asymmetry.

Preferably, the varying threshold voltage cells have first regions of lower threshold voltage and second regions of higher threshold voltage arranged alternately along the length of the stripe. The provision of only two different threshold voltage regions eases manufacture.

In preferred embodiments the first regions are distributed over the first major surface and along the stripes such that the total length of the first regions is less than 25% of the total length of the second regions. This ensures that a much larger current flows through the first regions in the linear regime.

Preferably a clamp circuit is arranged between the gate and drain or source, in preferred arrangements between gate and drain.

The prior art documents are concerned with operation in a continuous linear regime, generally with the FETs incorporated into some form of negative feedback loop.

The inventors have realised however that varying threshold voltage solves a problem also in switching applications. Such FETs generally have voltage clamp circuits to ensure that voltage spikes on the voltage rails do not cause destruction of the FET when the FET is turned off. This is achieved using a voltage clamp circuit between the gate and the source or drain, to switch the transistors partially on when a voltage spike occurs. In this state, current can pass through the FET but since the FET is not fully turned on power is dissipated in the FET.

Thus, by providing a voltage clamp in combination with the division of the FETs along the length of the stripes into low and high threshold regions the current density is increased thus avoiding thermal runaway in this application. The distribution of the low threshold regions along the stripes mitigates against current crowding that may be a problem in other arrangements.

Low and high doses of body dopant can be arranged along the length of the stripes to provide the low and high threshold regions.

Preferably, the threshold voltage in the second regions is in the range 0.5V to 1.5V higher than the threshold voltage in the first regions. This gives a sufficient discrimination in a linear operations regime but allows both regions to turn on with reasonable gate voltages.

In particular embodiments, the threshold voltage in the first regions is in the range 0.5V to 1.5V.

In a preferred embodiment, each cell includes: a source contact (16) connected to the sources of the plurality of the FETs in parallel; a drain contact connected to the drains of the plurality of the FETs in parallel; and at least one gate contact connected to the gates of the plurality of the FETs in parallel.

The invention also relates to the use of the FETs described above.

Figure 2:
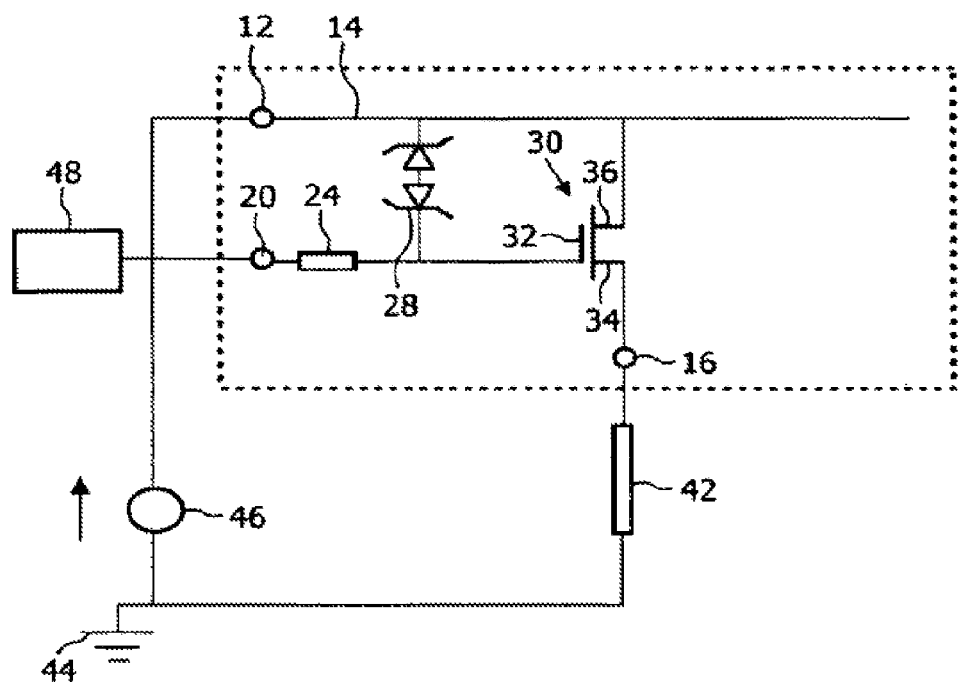
Figure 3:
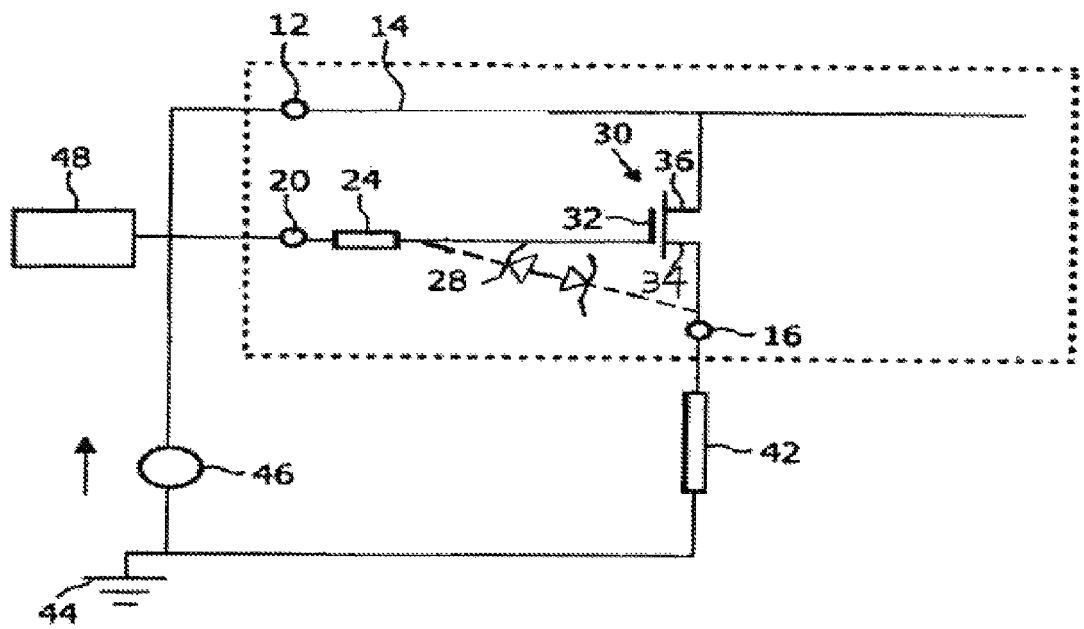

For a better understanding of the invention an embodiment will be described, purely by way of example, with reference to the accompanying drawings in which:

FIG. 1 shows a top view of a field effect transistor according to the invention; and FIG. 2 and FIG. 3 show two circuit diagrams of the field effect transistor according to the invention in use.

Referring to FIG. 1, a semiconductor substrate 2, in the example silicon, has a first major surface 4 as its upper surface. A plurality of cells 6 are defined in stripes on the first major surface 4. The cells 6 are divided along their length into normal regions 8 and low-threshold regions 10, the latter being shown shaded to distinguish them from the normal cells 8. The cells are laterally separated by gate trenches 50 which extend along the length of the stripes between adjacent cells 6.

Each cell 6 contains a field effect transistor 30 with gate 32, source 34 and drain 36 as shown in FIG. 2 and FIG. 3. The gate controls conduction in a body region between source and drain.

To achieve the low-threshold regions in this embodiment the doping in the body region is reduced in the low-threshold regions.

It will be noted that not all the stripe cells 6 contain low threshold regions 10, and that in those that do, the varying threshold voltage cells, regions 10 alternate with the normal regions 8. Further, the pattern is such as to distribute the low threshold regions 10 relatively evenly over the first major surface 4.

In a particularly preferred arrangement, the low threshold voltage is about 1V and the higher threshold voltage about 2V.

A drain contact 12 is connected to the rear of the substrate connected to a drain metallisation and hence the drain 36 of each field effect transistor 30 in parallel (see FIG. 2 and FIG. 3).

A gate contact 20 is connected to gate line 22 which is connected to gate trenches 50 through resistors 24. In the embodiment described, these resistors have the same value but this is not required. The gate 32 runs in the gate trenches 50, insulated from the semiconductor of the cells 6 by a gate insulator (not shown).

A source contact 16 is connected to a source metallization which is placed over the entire active area, shown as the dotted line source metallization 18 in FIG. 1. The source metallization is connected to the sources 34 of each field effect transistor 30 in parallel. The source metallization 18 is insulated from the underlying gate lines 22 by an insulating layer (not shown) for example formed from tetraethyl orthosilicate (TEOS).

In FIG. 2, a pair of back to back zener diodes 28 is connected between the drain 36 and the gate 32. In FIG. 3, a pair of back to back zener diodes 28 is connected between the source 34 and the gate 32.

In use, as shown in FIG. 2 and FIG. 3, a load 42 is connected between the source contact 16 and ground 44. Voltage source 46 is connected between the drain contact 12 and ground 44 and a gate drive circuit 48 is connected to gate contact 20.

In a normal mode of operation the transistors 30 are fully turned on and all cells operate.

In a linear mode of operation, the applied voltage is not such as to turn the transistors on. External effects, such as voltage spikes, can change the voltages. In the event of such a voltage change, such as a voltage spike, the back to back clamp zener diodes 28 cause the low-threshold regions 10 to turn on preferentially over the normal regions 8. Excess current is then dissipated in the low-threshold regions 10, which act effectively as resistors.

The current density in these low threshold regions 10 is much higher than it would be if all regions were used. With 1V and 2V thresholds in the low and high threshold regions, the current density may be about ten times higher in the low threshold regions than the higher threshold regions. This increased current density may be arranged to be above the critical current density $J_c$ and so the temperature coefficient is negative not positive. In this way thermal runaway is avoided. Alternatively, the thermal runaway effect may be reduced even if the critical current density is not achieved.

By distributing the low threshold regions 10 evenly over the first major surface 4, the rise in temperature of the complete device is even and hot spots are mitigated.

When the device is turned fully on, the device is normally overdriven, for example with a voltage of 10V. In this case, the low threshold regions will only take about 5% more current than the normal regions. This would normally be considered highly undesirable, since it leads to an increased on-resistance.

The invention is not limited solely to clamping embodiments, but can be used wherever power FETs are used in the linear mode.

Further, the invention is applicable to all forms of FET, whether vertical or horizontal. All that is required is that it is possible to vary the threshold voltage along the stripe.

Alternative approaches to varying the threshold voltage along the stripe are to vary the source or drain doping level or the gate dielectric thickness, and these are included within the scope of the invention.

In an alternative version, the back to back zener diodes 26 are provided externally of the circuit 2 rather than being incorporated within it.

From reading the present disclosure, other variations and modifications will be apparent to persons skilled in the art. Such variations and modifications may involve equivalent and other features which are already known in the design, manufacture and use of semiconductors and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A field effect transistor, comprising:
    a semiconductor substrate having a first major surface; and
    a plurality of transistor cells arranged in stripes extending across the substrate, each transistor cell including at least one field effect transistor having a gate, a source and a drain;
    wherein at least some of the plurality of transistor cells are varying threshold voltage cells, wherein each varying threshold voltage cell has a plurality of regions of different threshold voltages distributed along the length of the varying threshold voltage cell, wherein said each varying threshold voltage cell has first regions of lower threshold voltage and second regions of higher threshold voltage arranged alternately along the length of the varying threshold voltage cell, and wherein the low threshold regions in the varying threshold voltage cells are distributed evenly over the first major surface.

2. A field effect transistor according to claim 1, wherein the first regions are distributed over the first major surface and along the stripes such that the total length of the first regions is less than 25% of the total length of the second regions.

3. A field effect transistor according to claim 1 or 2, wherein the doping in the first regions is lower than the doping in the second regions to achieve the lower and higher threshold voltages.

4. A field effect transistor according to claim 1, wherein the threshold voltage in the second regions is 0.5V to 1.5V higher than the threshold voltage in the first regions.

5. A field effect transistor according to claim 1, wherein the threshold voltage in the first regions is in the range 0.5V to 1.5V.

6. A field effect transistor according to claim 1 further comprising a clamp circuit arranged between the gate and the drain or between the gate and the source.

7. A field effect transistor according to claim 1, wherein the plurality of transistor cells are separated by gate trenches extending along the length of the stripes between the plurality of transistor cells, the gate trenches containing the gate.

* * * * *